(12) United States Patent
Zeharhary et al.

(10) Patent No.: US 11,184,691 B2
(45) Date of Patent: Nov. 23, 2021

(54) METHOD BY WHICH AN ELECTRICAL RAW INPUT SIGNAL IS RESHAPED TO A FORMATTED ELECTRICAL INPUT SIGNAL ACCORDING TO THE INPUT REQUIREMENTS OF A SIGNAL PROCESSING DEVICE AND A SIGNAL FORMATTING CIRCUITRY

(71) Applicant: AMI GLOBAL, Las Vegas, NV (US)

(72) Inventors: Omer Zeharhary, Las Vegas, NV (US); Ori Peled, Las Vegas, NV (US)

(73) Assignee: AMI GLOBAL, Las Veags, NV (US)

( * ) Notice: Subject to any disclaimer, the term of this patent is extended or adjusted under 35 U.S.C. 154(b) by 0 days.

(21) Appl. No.: 16/816,223

(22) Filed: Mar. 11, 2020

(65) Prior Publication Data

US 2020/0296483 A1 Sep. 17, 2020

(30) Foreign Application Priority Data

Mar. 12, 2019 (DK) .............. PA 2019 00311

(51) Int. Cl.
*H04Q 9/00* (2006.01)
*H03K 17/687* (2006.01)
*H04W 88/16* (2009.01)

(52) U.S. Cl.
CPC .......... *H04Q 9/00* (2013.01); *H03K 17/687* (2013.01); *H04Q 2209/40* (2013.01); *H04W 88/16* (2013.01)

(58) Field of Classification Search
CPC ................ H04Q 9/00; H03K 17/687
See application file for complete search history.

(56) References Cited

U.S. PATENT DOCUMENTS

| | | | |
|---|---|---|---|
| 6,424,121 | B1 | 7/2002 | Khouri et al. |
| 9,373,243 | B2 * | 6/2016 | Martin .................. G08B 29/24 |
| 2006/0054335 | A1 | 3/2006 | Rapp et al. |
| 2009/0086692 | A1 | 4/2009 | Chen |

(Continued)

FOREIGN PATENT DOCUMENTS

| | | |
|---|---|---|
| CN | 206208961 U | 5/2017 |
| EP | 3450996 A1 | 3/2019 |
| KR | 2010 0079236 A | 7/2010 |

OTHER PUBLICATIONS

Danish Patent Application No. PA 2019 00311, Search Report completed Jan. 21, 2020—4 pages.

(Continued)

*Primary Examiner* — Qutbuddin Ghulamali
(74) *Attorney, Agent, or Firm* — Lathrop GPM LLP

(57) ABSTRACT

The invention concerns a method for reshaping a electrical raw input signal to a formatted electrical signal and a gateway adapted to receive a range of wireless and wired sensory input, which are processed and packaged and then delivered to a remote data storage facility by use of a cellular network and an on board cellular device, wherein the gateway comprises a signal formatting circuitry and programmable signal processing device where the signal formatting circuitry is adapted to receive an electrical raw input signal and comprise means to reshape the raw input signal to a formatted electrical input signal according to input requirements of a signal processing device.

12 Claims, 13 Drawing Sheets

(56) References Cited

U.S. PATENT DOCUMENTS

| | | | |
|---|---|---|---|
| 2009/0195257 A1* | 8/2009 | Hasenberg | G01R 31/2829 |
| | | | 324/555 |
| 2010/0316167 A1* | 12/2010 | Tang | H03K 5/082 |
| | | | 375/316 |
| 2011/0261738 A1 | 10/2011 | Mukherjee | |
| 2013/0212214 A1 | 8/2013 | Lawson et al. | |
| 2018/0026541 A1 | 1/2018 | Hashimoto | |

OTHER PUBLICATIONS

European Patent Application No. 20161241.3, Extended European Search Report and Opinion completed Jul. 6, 2020; 8 pages.

* cited by examiner

External Power mode

METHOD BY WHICH AN ELECTRICAL RAW INPUT SIGNAL IS RESHAPED TO A FORMATTED ELECTRICAL INPUT SIGNAL ACCORDING TO THE INPUT REQUIREMENTS OF A SIGNAL PROCESSING DEVICE AND A SIGNAL FORMATTING CIRCUITRY

CROSS-REFERENCE TO RELATED APPLICATIONS

This application claims the benefit of priority to Danish Patent Application No. PA 2019 00311 filed Mar. 12, 2019, which is incorporated herein by reference in its entirety.

BACKGROUND

The present invention relates to a method for reshaping an input signal according to the needs of a signal processing device in a simple way in which no information content of the signal is lost. The invention also comprises a formatting circuitry, which may be adapted to various input signals, and always deliver an input signal in a predetermined range.

It is known to provide circuitry, which is adapted to handle input signals at various levels by routing the input signal through voltage dividers according to the level of the input signal. This is done by the use of so-named "jumpers" which in effect are hand operated switching devices. This technique does not allow an input signal circuitry to be adapted to a new input level using only programmable elements, which may be upgraded wirelessly, but it demands, that the device which handles the inputs signal is physically accessed and that one or more jumpers are moved about on a circuitry board.

Thus, there is a need for a method and an apparatus which enables a new formatting of an input signal to be adopted, even if the device has not been opened and no hardware changes has been implemented.

SUMMARY OF THE INVENTION

The object of the present invention can be achieved by a method as defined in claim 1 and by signal formatting circuitry having the features defined in claim 5.

Preferred embodiments are defined in the dependent subclaims, explained in the following description and illustrated in the accompanying drawings.

The method according to the invention is a method by which an electrical raw input signal is reshaped to a formatted electrical input signal according to the input requirements of a signal processing device. The method comprises the following steps:
  feeding a parameter to a programmable device according to the expected raw input signal format in order that;
  the programmable device may deliver one or more output control signals in dependency of the parameter whereby;
  each control signal is served at each its switching device provided in a signal line arranged between the raw input signal potential and ground potential wherein;
  the control signals allow switching devices to connect the raw input signal potential to ground potential through a resistor of predetermined size, whereby each resistor has a terminal which is connected to the input signal potential and a terminal connected to ground potential to create the formatted input signal at the terminal of the resistor which is connected to the inputs signal potential.

Hereby it is achieved that a parameter, which has been loaded into a programmable devise is instrumental in determining the size of a resistor inserted between the raw electrical input signal and ground potential. The switching device may be chosen so that its state is easily controlled by usual control signals stemming from microcontrollers or similar devices. This allows software changes, such as setting a predetermined parameter in a programmable device to determine how a raw input signal, which is to be recorded in a signal processing device is reshaped in terms of voltage level, and the raw input signal may thus be adjusted to the input range of the signal processing device.

Preferably the switching device is a semiconductor device, such that the switching is controllable essentially without power consumption and at voltage levels commensurate with output levels or programmable semiconductor units without use of intermediate power or voltage step up elements.

It is preferred that a first switching device in a closed state connects the raw input signal to ground potential through at least one resistor, and in an open state connects the raw input signal unaffected to the signal processing device. When the switching device is in closed state, it allows an electrical potential and currents to flow between two of its connection points and it is here preferred that in this state, it connects a resistor to ground potential, where the resistor at its other end is connected to the raw input signal. In this way the voltage of the input signal is divided and by choosing the right size of the resistor, any scaling of the raw input signal is possible. When the switching device is in open state, it interrupts the connection between the small resistor and ground potential, and in this case only a security resistor will reside between the raw signal terminal, and the signal processing device. The security resistor shall not change the electrical potential of the input signal, as the signal processing device in itself consumes little or no current.

Preferably the second switching device leaves the raw input signal unchanged when it is open, and in a closed state connects the raw input signal to ground potential through a high precision resistor which has a resistor value within an accuracy of 1% and has a linear characteristic whereby an accurate voltage division is allowed, such that irrespective of the current level in the high precision resistor, the voltage level in an input line in front of the high precision resistor is a measure of the current running through the high precision resistor. This allows the voltage level in the input line to be measured as the formatted electrical input signal, which then may be easily recalculated to designate the current running through the high precision resistor, and by this provision, a precise measure of the current flowing in the raw input signal may be determined.

By the above measures, a variety of different sensors may be used, and coupled directly to an input gate, where whatever signal a particular sensor produces, is scaled according to the required input format by simply setting parameters in a memory space, either directly in a microcontroller or in a separate durable memory device such as a well-known E$^2$prom wherefrom the microcontroller retrieves the parameter.

It may be beneficial that the first switching device receives a control signal in order to be open whenever the second switching device receives a control signal in order to be closed. In this way, only one of the resistors at a time, at the first and second switching devices will be a part of the reshaping measure of the raw input signal.

In a further aspect, the invention comprises a signal formatting circuitry and a programmable device, where the signal formatting circuitry is adapted to receive an electrical raw input signal and comprise means to reshape the raw input signal to a formatted electrical input signal according to the input requirements of a signal processing device. According to this aspect of the invention, the programmable device is programmed to deliver control signals according to a received parameter, which parameter is in accordance with the expected raw input signal format. The signal processing device is adapted to deliver output control signals at switching devices provided in a signal line arranged between the raw input signal potential and ground potential wherein the switching devices are adapted to connect the raw input signal to ground potential through each their resistor of predetermined size, whereby each such resistor has a terminal connected to the input signal and a terminal connected to ground potential to create the formatted input signal at the terminal of the resistors which is connected to the input signal.

Preferably, a first switching device is provided, which in a closed state is adapted to connect the raw input signal to ground potential through at least one resistor, and in an open state is adapted to connect the raw input signal to the signal processing device unchanged in order to gain two differently reshaped input signals, formatted according to each their input signal level thereby ensuring two different voltage divisions of the raw input. This allows a simple control of the shaping and formatting of the raw input signal, such that it may be served at a signal processing unit, such as an analog to digital converter, possibly embedded in a larger single processing unit, such as a microcontroller or CPU. Such devices usually accept input signal in a predefined voltage range, namely 0-3, or 0-2.5 volts, and thus if the raw input is in the 0-10 volts range, such a signal shall have to be scaled to a lover voltage range in order to avoid loss of information in the signal. The device provides the means for such a scaling and ensures, that the scaling, when the raw input voltage range is known in advance, may be easily controlled by setting up the switching device.

Preferably the circuitry comprise a second switching device which in an open state is adapted to leave the raw input signal unchanged, and in a closed state is adapted to connect the raw input signal to ground potential through a high precision resistor which has a resistor value within 1% accuracy and has a linear characteristic whereby an accurate voltage division is allowed, such that irrespective of the current level in the high precision resistor, the voltage level in the input line in front of the high precision resistor is a measure of a current running through the high precision resistor. The current could be in the range from 0 to 20 mA, however other current indicators may be used, but this requires the use of a differently sized precision resistor. By only having two switching devices and a few resistors the raw input signal may be in two different voltage levels or comprise a current indicator. All three may be reshaped as desired to fit the input range of 0-2.5 volts, using only programmable outputs from a microcontroller. The switching devices are preferably semiconductor based, such that they may be closed and/or opened using the usual output level from another semiconductor element. This ensures swift and safe operation, and also the power consumption remains very small for this type of switching devices.

In an embodiment, the first switching device and the second switching device are part of one and the same dual n-channel MOSFET device. This allows for a very compact design, and the dual n-channel MOSFET is a very common component which may be purchased at different producers and at a fair price. In its closed state, the internal resistance is very small, and leakage currents in the open state is also close to zero. Further, these devices are very durable and wear resistant. They also are easily mounted onto circuitry boards and may gain connection therewith through usual welding techniques such as through oven or wave welding.

In an embodiment of the invention, the signal processing device is adapted to receive a formatted input signal in the range of 0.0 VDC-2.5 VDC, and that the smaller resistor and the larger resistor and the high precision resistor are dimensioned such that electrical raw input signal in the ranges 0.0-2.5 VDC, 0-10 VDC and 0-20 mA are each transferred to the formatted input signal range in dependency of the output control signals provided from the programmable device to the dual n-channel MOSFET device. In this way the circuitry may be adapted to receive signals in a large variety of ranges. It is possible further to add an amplifier to the circuitry, such that signals stemming from thermoelements may also be served in the input range of 0.0 VDC-2.5 VDC to a signal processing device. This conversion preferably take place before routing the thermocouple signal through the describe formatting circuitry.

Any number of the above specified signal formatting circuitry may be provided. In an embodiment 4 such circuits are assembled on a PCB and each have an input connector where the raw electrical input signal is served at the circuitry, and each has a connection line for serving the formatted input signal to a signal processing device, whereby further the signal processing device comprises 2 output lines for each of the 4 circuits, such that the two MOSFET elements in each circuit may be set according to the known format of the raw unformatted input. Preferably the means for programming the signal processing device comprise one or more of: a BLE (Bluetooth low energy) wireless communication device, a wire line connector to the signal processing device, a cellular communication device with wired connection to the signal processing device.

In yet a further aspect of the invention, it concerns the use of a formatting circuitry of the above kind, where the circuitry along with a programmable device and a signal processing device are part of a gateway adapted to receive a range of wireless and wired sensory input, which are processed and packaged and then delivered to a remote data storage facility by use of a cellular network and an on board cellular device. This use greatly enhances the versatility of a gateway solution as it allows a wider range of sensory inputs to be accepted and processed. The gateway is described in further detail below and by adding one, two or more examples of the circuitry as described, it will be possible to receive a wide range of differently formatted signals, and by programming the CPU it becomes possible to change the kind of data, which are routed to the gateway. This makes the gateway extremely flexible.

DESCRIPTION OF THE DRAWINGS

The invention will become more fully understood from the detailed description given herein below. The accompanying drawings are given by way of illustration only, and thus, they are not limitative of the present invention. In the accompanying drawings.

DETAILED DESCRIPTION OF THE INVENTION

Figure 7:
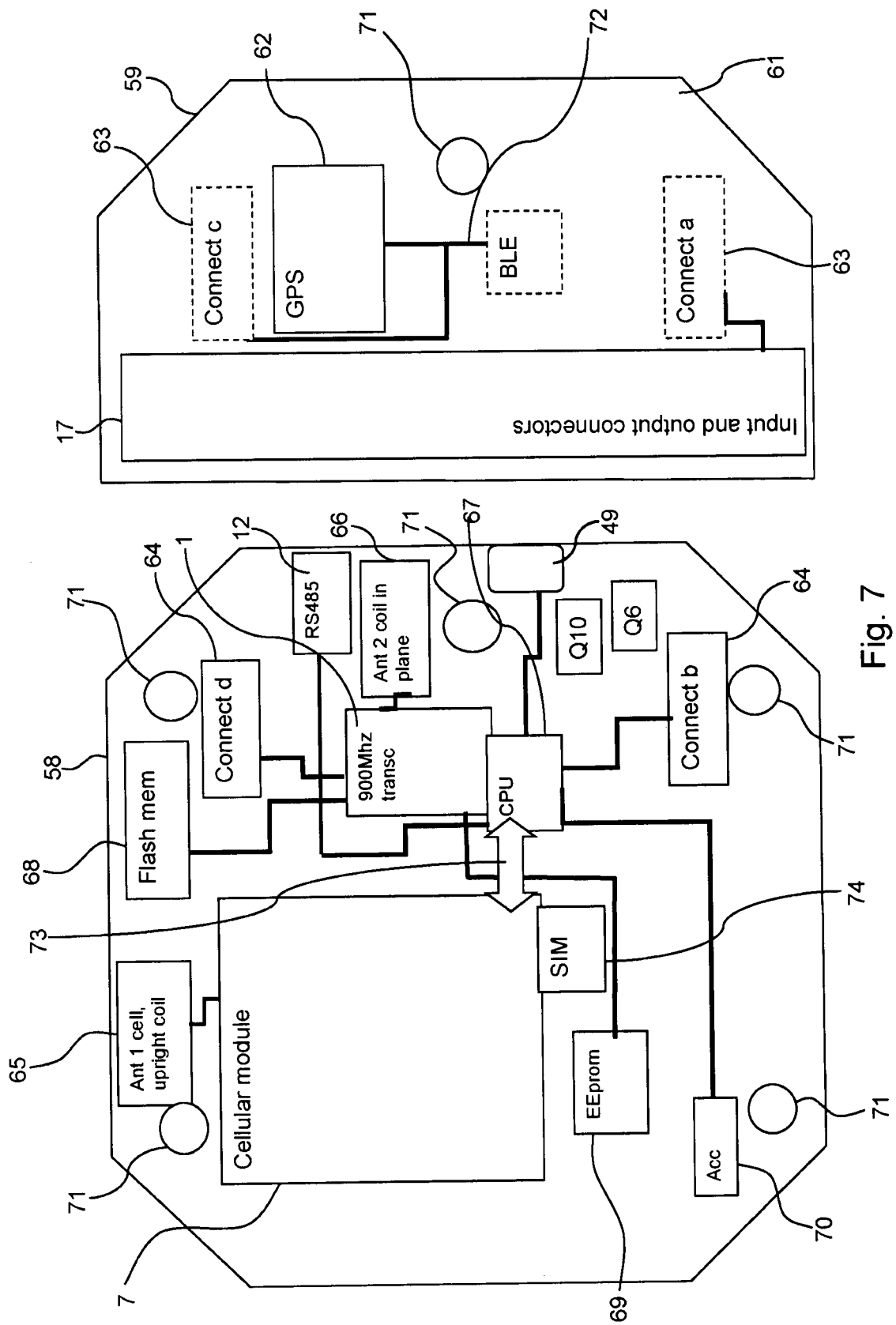
FIG. 7 shows a schematic front view of the two PCB elements in the housing.
Figure 9:
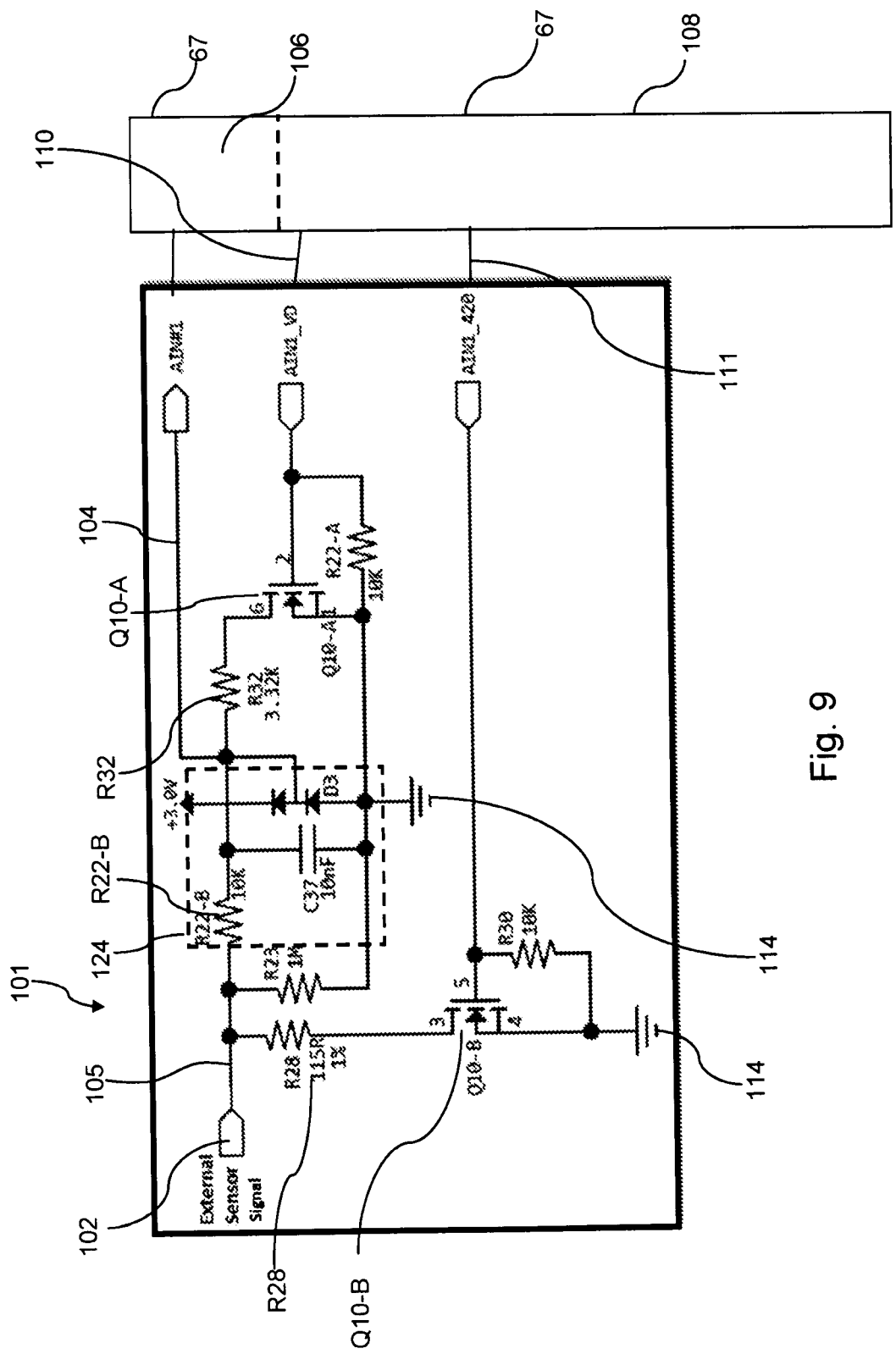
FIG. 9 shows a schematic plan of the main components in a circuitry according to the invention.

Referring now in detail to the drawings for the purpose of illustrating preferred embodiments of the present invention, circuitry according to the principles of the present invention are illustrated in FIG. 9. The raw input signal 102 labelled External Sensor Signal in FIG. 9 is served at the circuitry as illustrated by the arrow. The signal is an analog signal from a sensor such as a pressure or motion sensor, or thermocouple sensor which has been amplified in a well-known manner. The reshaped and formatted input signal is presented in signal line 104 and is served at a signal processing device 106, such as a microcontroller 67. The input terminal to the microcontroller is labelled AIN #1 in FIG. 9. The signal processing device 106 is part of the microcontroller 67, which is also the case with the device as it is constructed. This is illustrated in FIG. 7. Here the microcontroller is labelled CPU (Central Processing Unit) and this unit is built to also comprise the 900 Mhz radio transceiver. The signal controller is programmable, and its programmable part is termed "programmable device" 108 and indicated in FIG. 9.

In case a sensor is connected which has an output range commensurate with the input voltage range of an input channel AIN #1 of the microcontroller 67, the signal need not be re-scaled, however as a security measure, a usual security circuit 124 shall be inserted in order to protect the microcontroller against overload. Thus, the dual diode D3 with resistor R22-B form a protection circuit 124 to assure that the voltage on the AIN #1 point will not be higher than 3.7V (the supply voltage 3.0V plus the diode 0.7V forward voltage) or lower than −0.7V thus preventing damage to the CPU (67) ADC input pin. In FIG. 9, a larger resistor labelled R23 is inserted between the input line 105 and ground potential 114. The resistance is 1 M Ohm and compared to the ohmic value of the smaller R32, which is 3.32 k Ohm the resistance of the larger resistor is orders of magnitude bigger. The first switching device Q10-A is either open and allows no current through the smaller resistor R32 or closed, so current may run through the resistor R32 and the switching device Q10-A to reach the ground potential at 114. When the first switching device Q10-A is open, the 0-2.5V measurement range mode is instigated, (both MOSFETs Q10-A and Q10-B as shown in FIG. 9 are not turned on). The voltage from an External Sensor Signal at input point 102 in line 105 is passed through R22-B to AIN #1 point unchanged.

When the first switching device Q10-A is closed (corresponding to MOSFET Q10-A being turned on, while MOSFET Q10-B being not turned on), the 0-10V measurement range mode is instigated. Here the voltage from the external sensor signal at 105 is passed through a 0.25 ratio voltage divider constructed from R22-B and R32 to the AIN #1 point.

The state of first switching device Q10-A is controlled by a first output control signal 110 from the microcontroller 67. In FIG. 10 this signal is labelled AIN1_VD, and its feed line is indicated by an arrow, as in the actual device the microcontroller does not reside next to this part of the circuitry, as is schematically indicated in FIG. 7.

The second switching device Q10-B allows high precision resistor R28 which at one end is connected to the input line 105, to be either isolated from or connected to ground potential 114 at its other terminal. Thus, here a further voltage split is possible. Q10-B is turn on, while Q10-A is not, and the current from the External Sensor Signal point 102 is passed through R28 and Q10-B to the ground. The voltage developed over R28 passed through R22-B to AIN #1 point unchanged. The significance of the high precision of resistor R28 is that this allows the voltage in the input line 105 at the other connection point of the resistor to be an accurate indicator of the current flow from input line 105 and to ground potential 114. Thus, if the raw input signal 105 is a signal of the kind where the current is an indication of the size of a measured property, the electrical potential transmitted through line 104 to the signal processing device 106 shall be an indicator of the current value transmitted through line 105 and the high precision resistor R28 and to ground. The voltage developed over R28 passed through R22-B to AIN #1 point unchanged. Measuring the current in this way requires the first switching device Q10-A to be open, so there are no current losses (and thus reduction in potential) through the smaller resistor R32. It also requires, that the resistor R28 has a linear characteristic, so that the resistance value is independent of current flow through the resistor and the temperature inside the resistor.

A second output control signal 111 guides the stat of the switching device Q10-B. As seen in FIG. 9, this signal is served at the switching device at gate labelled AIN1_420.

First switching device Q10-A and second switching device Q10-B are part of one and the same MOSFET dual n-channel package and in FIG. 7 this package is labelled Q10.

One further such MOSFET dual n-channel package is indicated in FIG. 7 and labelled Q6. Two more such devices shall be provided (not indicated in the figures) in order to handle up to 4 analog input signals as they may be added at input and output connectors 17 on the top board 59, and as explained in the following. Q6 and the two more such devices are each connected with a circuitry network as shown in FIG. 9 and explained above.

In case a thermocouple temperature measurement is conducted, the top board shall comprise an amplifier (not shown) which, based on the potential delivered at the connection point of the cold end of the thermocouple, shall amplify this signal to a level which is usable as input through input line 104 to the signal processing device 106. Thus, the top board may come in various versions, depending on whether thermocouple elements are to be used or not. The top board is also easy to disconnect and remove from the gateway, in order that a replacement board may be installed in accordance with possible changes in the use of the gateway.

Figure 1:
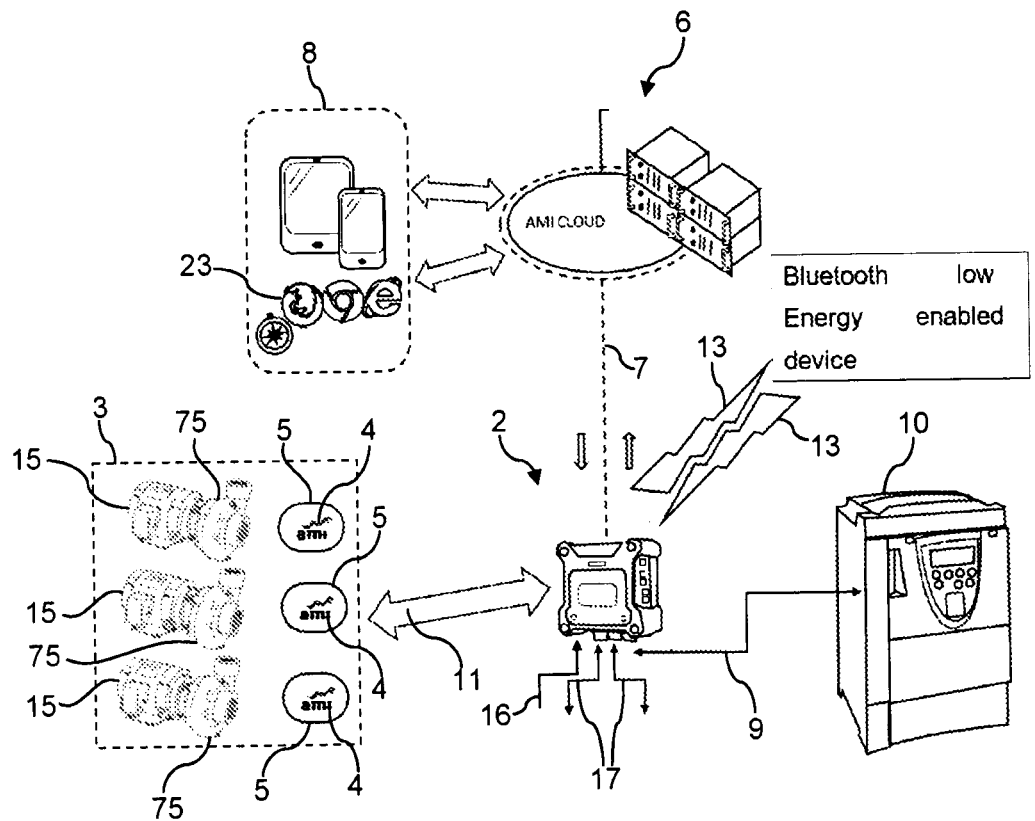
FIG. 1 shows a schematic view of a gateway 2 with the main communication canals shown.

Referring now in detail to the remaining drawings for the purpose of illustrating preferred embodiments of the present invention, a gateway 2 of the present invention is illustrated in FIG. 1 with accompanying peripherals.

FIG. 1 is a schematic view of an intermediate data storage and data processing unit hereinafter named gateway 2 according to the invention. The gateway 2 comprises a number of communication or routing options marked by the various arrow symbols, and also comprises a certain internal data storage (not shown) and calculation capability, such that more processed data may be delivered out of the gateway 2. This saves valuable communication time and/or may delay delivery of data to a remote data storage or repository 6 according to a transmission schedule determined in advance or determined by available power.

The gateway comprises a 900 MHz RF two-way communication radio and arrow 11 indicate a number of channels for wireless communication with this radio. Remote sensors 4 with accompanying 900 MHz transceivers are provided to send sensed conditions at each their communication channel to the gateway 2. In FIG. 1 the industrial process 3 which is monitored comprise a series of motors, and in this case electrical motors 15 which may be used for driving pumps 75 at a pumping station. The sensors 4 here are vibration sensors and by this arrangement it is possible to document wear on either pump or the motor driving each pump or both. However, any other possible measurable conditions such as temperature, speed or pressures may be measured at each motor 15 or accompanying pump 75 and measured values forwarded to the gateway 2.

As seen in FIG. 1 the data which arrives at the gateway via wireless signals 11 may be transferred further to a remote data storage facility 6 via a communications network. Such a facility is also known as a cloud storage 6. The communications network used to transfer the data onto the cloud data storage 6 is in this case based in cellular communications network such as a telephone network. The cellular device 7 is itself located inside the gateway 2, but as the cellular device communicates via a network the entire entity of cellular device and network is marked 7.

At the remote data storage 6 or the cloud, the transferred data will be available for further processing by way of usual internet access using a browser 23 on a communication device. Thus, the cloud data may now be further processed, either at the cloud facility or after download to a customer device, in order to glean off further information about the industrial process 3.

Also, from the remote cloud data store 6, data streams may be targeted back towards the cellular device 7 in the gateway 2, and thus the gateway 2 may be instructed to feed control signals 9 to a control device 10. This is achieved by including a R5485 communication port in the gateway, such that the control device could be a PLC type of device which then may target the industrial process, such as the motors 15 driving the pumps 75, in order to change the process going on here. This may be individually targeted at each pump in a control circuit inside the pump or more usually by instructions to a control box or panel, possibly inside the control device 10, which then changes the power feed to each pump.

In the above example of the invention, pump drivers and pumps constitute the industrial process, but any kind of industrial process be that a chemical, a mechanical, a biological or electrical process or combinations thereof could be the target for use of the gateway.

In FIG. 1 it is further illustrated how BLE (Bluetooth low energy) communication 13 is also part of the gateway 2. This communication option is used whenever an operator at or near the gateway needs to change and/or look into the operational mode of the gateway 2. The operator puts a magnet in close proximity of the gateway 2 in order to change the state of a reed switch 49 inside the gateway 2 (see FIG. 7), and the rising edge of the reed switch signal triggers the turn off of a GPS 62 receiver and energize a BLE transceiver 61 in the gateway 2. Now the gateway may be programmed using the BLE communication channel 13, and as long as this channel remains active, the GPS 62 is turned off. When BLE communication channel has not been active for a time, the device changes back to normal mode, and accepts the GPS coordinates and turns off the BLE communication means.

There is also a power supply line 16 and a number of further communication options, such as analogue input terminals 17 and digital input terminals 17 provided at the gateway 2. Analogue input lines comprise the following options in a preferred embodiment: 0-3V; 0-10 v and 4-20 mA input options. The digital input may comprise a high-speed counter.

A GPS 62 is included into the gateway 2, such that the exact position and an exact time signal is always available at the gateway. The time signal is useful in case precisely timed measurements are desired, and the GPS signals giving the exact location of the gateway may also come in handy in case the gateway is used on board moving vehicles such as ships, air flights, trains or other transportation equipment.

Figure 5:
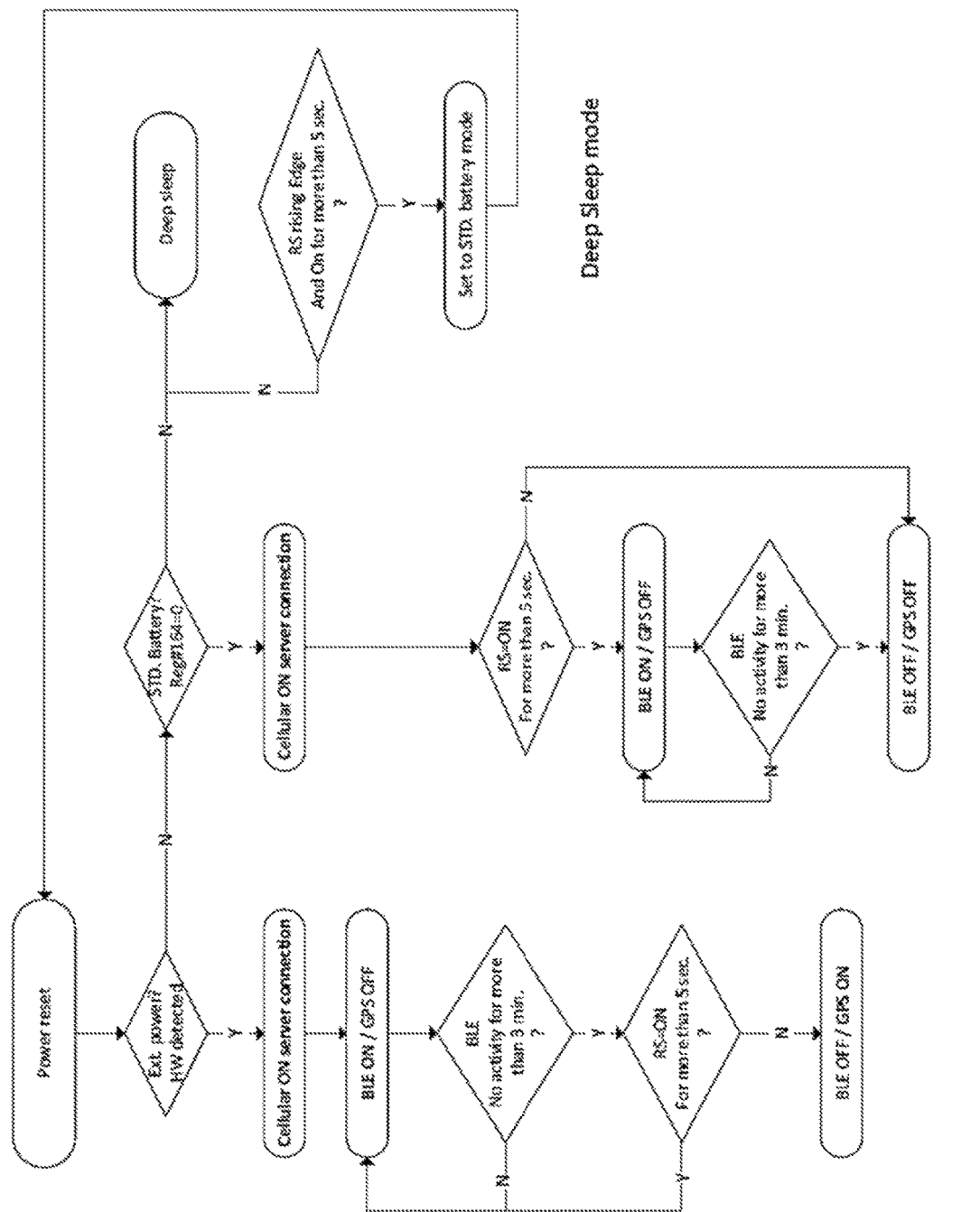
FIG. 5 is a route diagram showing the basic function of the gateway.
Figure 5A:
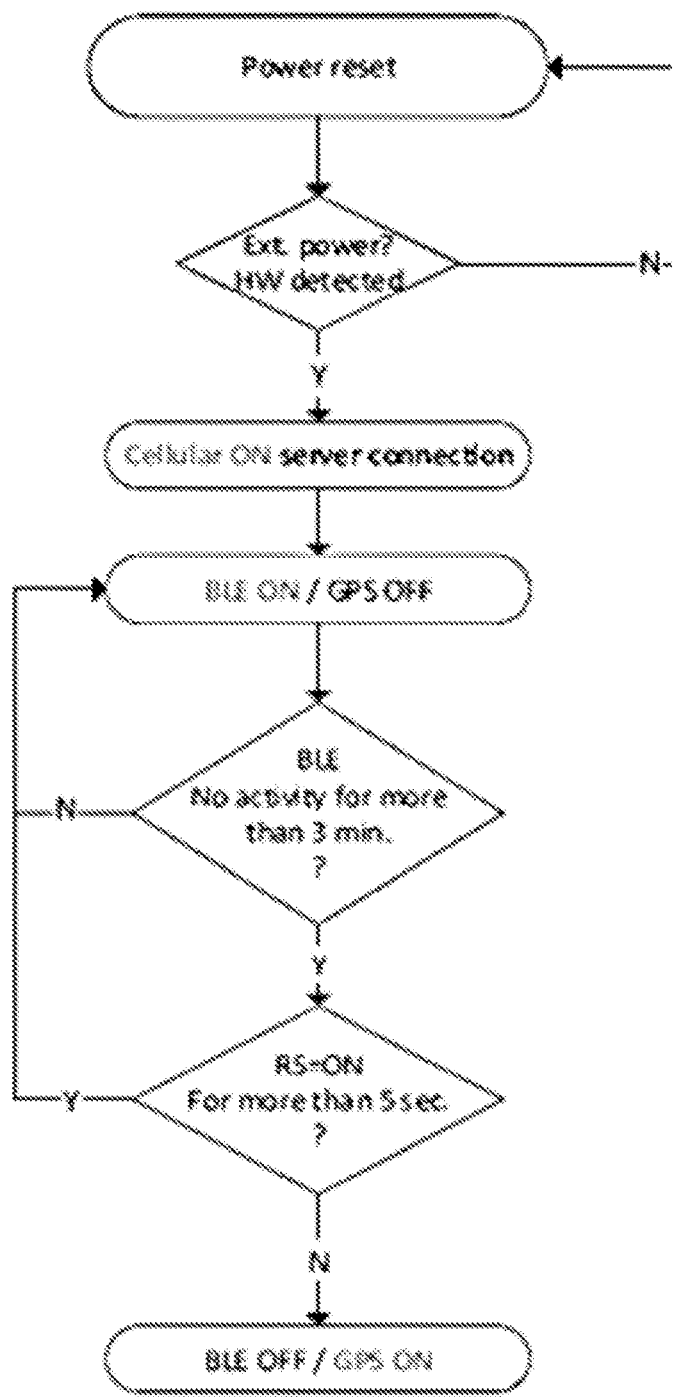
FIG. 5A is the left-hand part of the route diagram shown in FIG. 5 in shown somewhat enlarged.
Figure 5B:
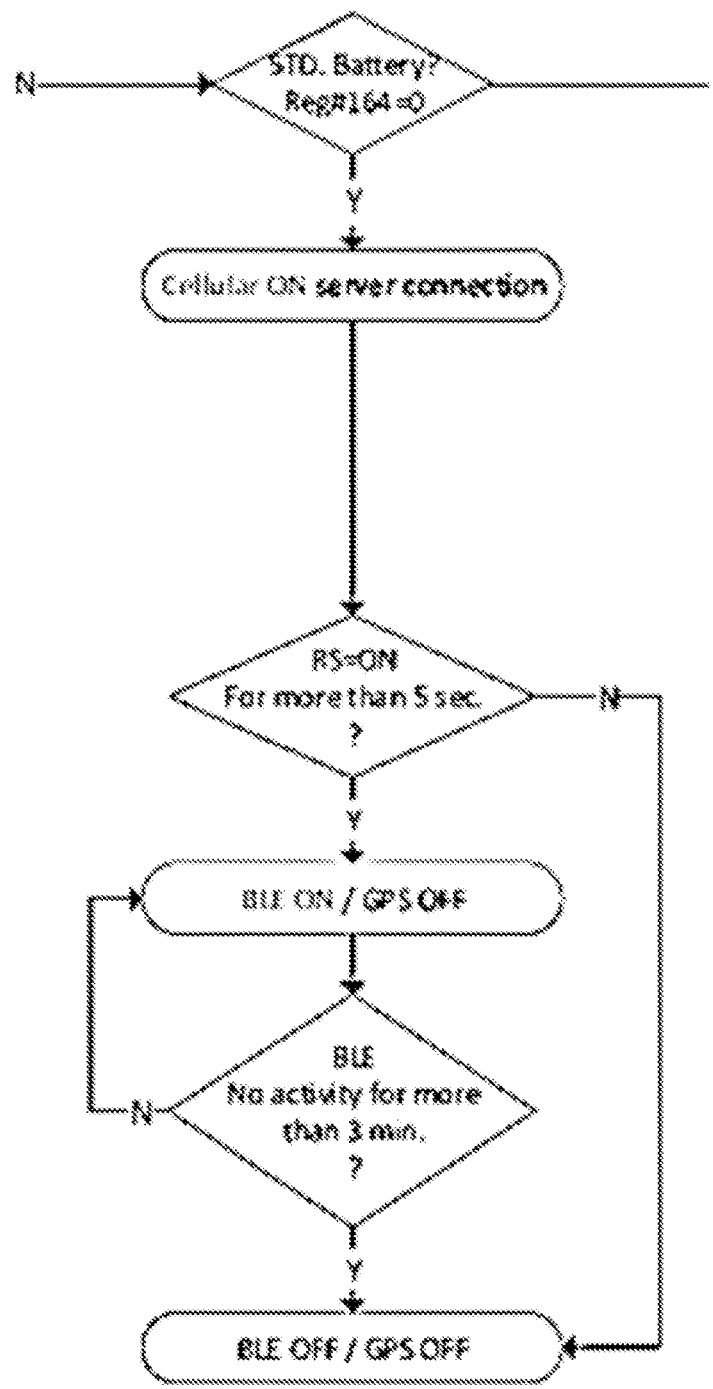
FIG. 5B is the middle part of the route diagram shown in FIG. 5 in shown somewhat enlarged.
Figure 5C:
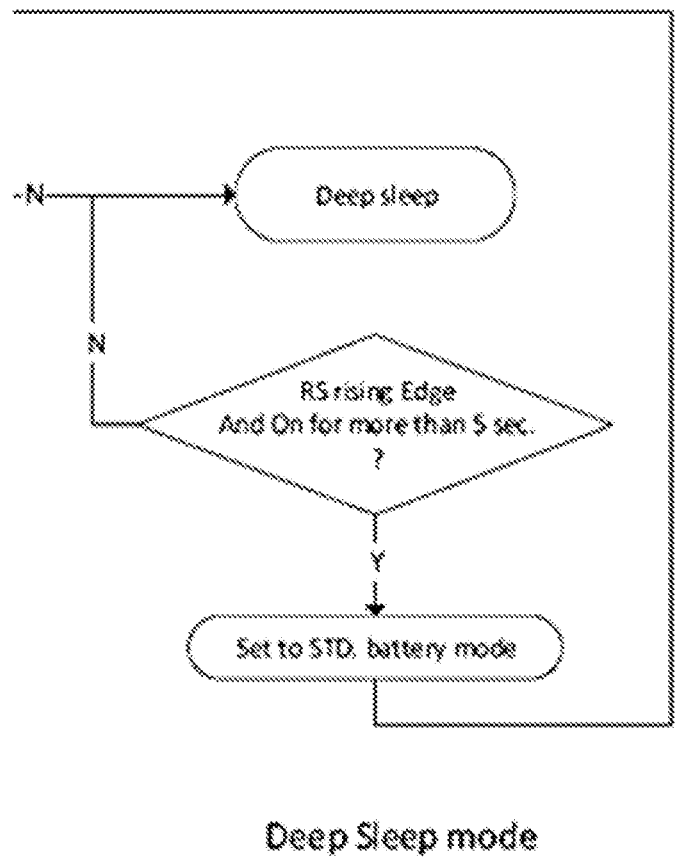
FIG. 5C is the right-hand part of the route diagram shown in FIG. 5 in shown somewhat enlarged.

The BLE communication device 61 and the GPS device 62 share a communication line, so that only one of the two may be in communication with the gateway CPU/microcontroller at any given time. This is ensured by the communication and control protocol disclosed in FIG. 5. The three columns represent the working mode of the gateway 2 at three different conditions:

1) external power supply is available
2) only battery power is available
3) no external power supply is available and battery power is low.

Mode 1, External power supply mode: The first mode is instigated, whenever the various active hardware parts of the gateway are detected in step 1a, and the external power is available. Here in step 1b, the cellular device 7 is activated for connection to the remote data storage 6. The cellular device now works with full load and is continuously on, and regularly transmits data to the remote data storage, up to 20 sample/hour and 8 updates to the data storage per day. Also, in this mode, the 900 Mhz radio 11 is active and shall receive up to 80-byte messages every 10 seconds in short bursts. The RS485 adapter 12 is continually turned on for communication with an external control device 10. In following step 1c, the BLE is turned on, and the GPS is turned off. In step 1d, it is checked, if the BLE line is active, and as long as this is the case, the device remains in this mode with BLE turned on and GPS turned off by return to step 1c. In case it is detected, that the BLE has been inactive for some time, here 3 minutes, a further check is made in step 1e, namely whether the reed switch has been active for more than 5 seconds. If this is the case, BLE remains on, and GPS remains off by return to step 1c. The reed switch activity indicates that someone close to the device requires communication via the BLE channel. If the reed switch has not been identified as on for more than 5 seconds, the BLE is turned off, and GPS is switched on in final step 1*f*. As mentioned, this saves a communication line out of the microcontroller 67, as one and the same line is used to communicate with the BLE device as well as the GPS device. Savings up to 10% may be achieved by this.

Mode 2, only battery power is available: in mode 2 it is initially detected in a step 1*a*, that there is no external power available, and as a result of this, the battery state is consulted in step 2*a*, and if there is sufficient battery power available, the cellular device 7 is turned on in order to communicate with the remote data storage 6. However, in reduced mode, so that the cellular device is intermittently active such as up to 12 times/day and uploads data to the remote data storage 6. Also, in this mode, the 900 Mhz radio communicates less frequently with external devices, such that messages are only received once every minute and the messages contain bursts of up to 80 bytes. The RS485 adapter is muted in this mode.

In step 2*c* it is determined whether the read switch has been on for more than 5 seconds. In the affirmative, the BLE is activated, and the GPS is turned off in step 2*d*, in order that the device becomes available for communication via the BLE channel. In case the read switch has not been on for more than 5 seconds, the BLE and the GPS are both turned off in step 2*f*, so that the GPS does not consume power in battery mode. In step 2*e*, it is checked whether the BLE has been active for more than 3 minutes. If not, step 2*d* is repeated, otherwise BLE is turned off and GPS is turned off as well in step 2*f*.

Mode 3, no external power supply is available (affirmed in step 1*a*), and battery power is not available (affirmed in step 2*a*): here in step 3*a* deep sleep mode is entered, which is illustrated in step 3*b*, where only read switch signal in terms of rising edge detection remains active. If a rising edge is detected and the read switch has been detected as on for more than 5 seconds, the mode is set to standard battery mode and a power reset is instigated whereby power sources are checked. If no read switch signal is detected, the deep sleep mode remains unchanged.

The gateway itself is also home to various sensors, which may determine conditions inside the gateway 2 or outside it. Notably, an accelerometer is provided, a temperature measuring device is provided and further a measuring device such as the mentioned reed switch is included. The gateway may switch automatically between battery powered mode and power line mode according to the state of the power line 16. The further internal sensors may be used to determine conditions at the device to which the gateway is attached, such as vibration level and temperature.

The gateway 2 comprises batteries 14, which are exchangeable in the usual way through a lid 32 to a battery compartment 30 as disclosed in FIG. 2 and FIG. 4A-FIG. 4C. Rechargeable batteries are preferred, in order to keep the need for battery replacements at the lowest possible level. Whenever external power is available, the batteries may thus be charged.

Figures 4A, 4B:
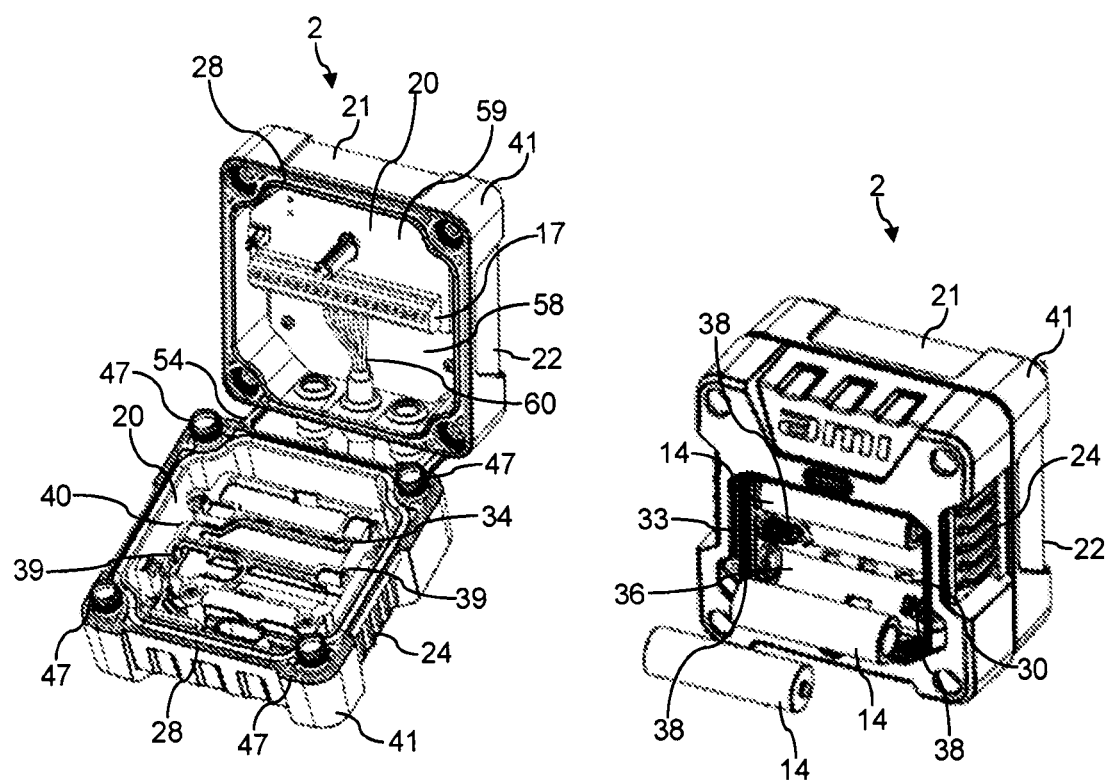
FIG. 4A shows a perspective view of an opened-up gateway 2.
FIG. 4B is the gateway 2 with removed battery cover.
Figure 4C:
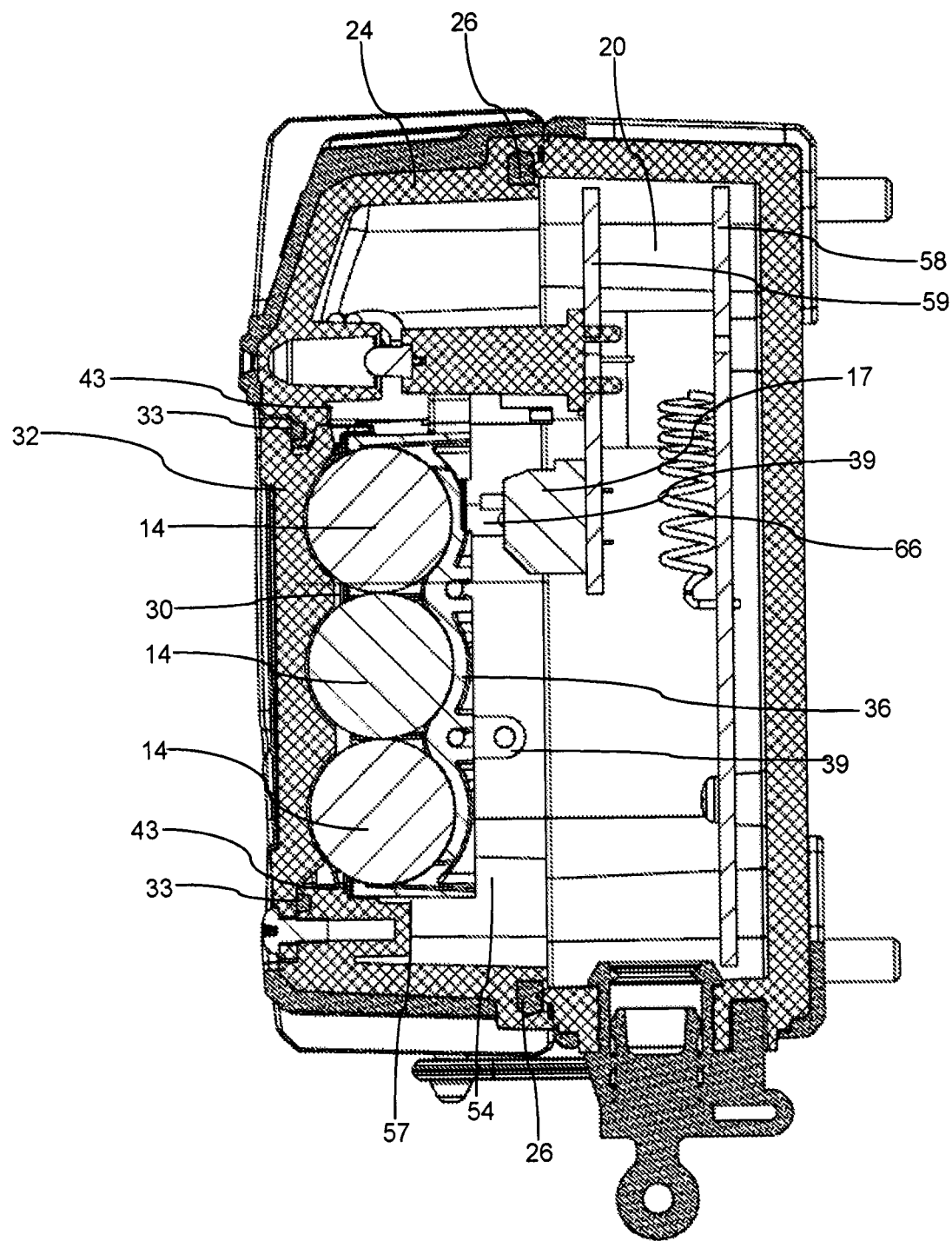
FIG. 4C is a sectional view of the gateway.

As further seen in FIG. 4A, FIG. 4B and FIG. 4C, the battery compartment 30 is comprised of a partition wall 36, which has in-moulded battery connectors 38 at the one side and solder pads 39 for leads 40 to connect the batteries 14 to the gateway devices at an opposed side thereof. This partition wall 36 is seated from the back side towards the cover 24 with a partition wall gasket 43 and access to the battery compartment is granted through a removable lid 32, which is fastened to the frontside of the cover 24. In this way it becomes possible to change battery through the frontside of the cover 24 without compromising the sealed off and moisture tight enclosure 20 of the gateway 2. The removable lid 32 is also connected to the cover 24 via a battery lid gasket 33 to ensure vapor tightness of the battery compartment 30.

Figure 2:
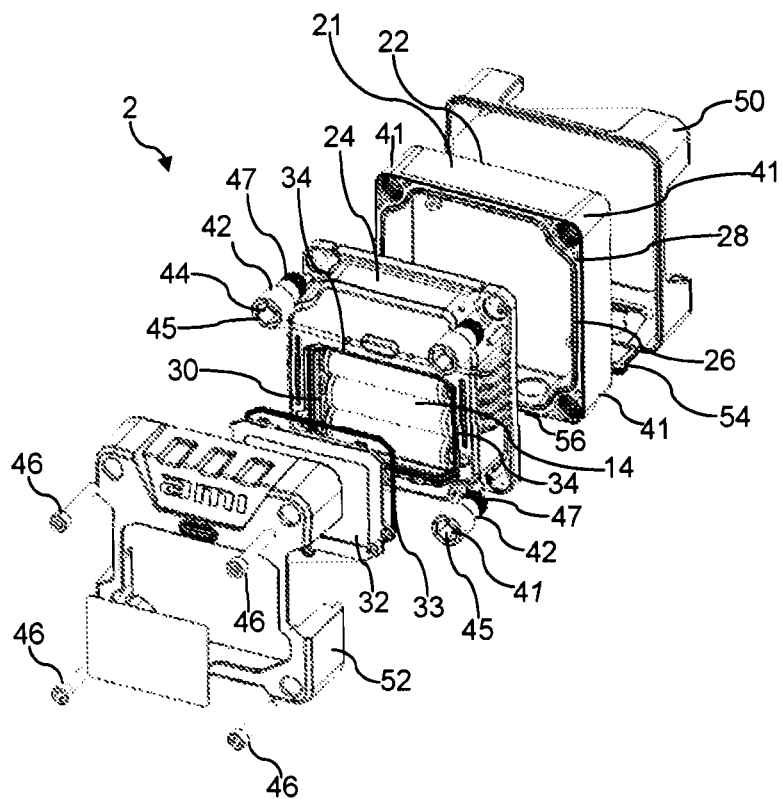
FIG. 2 shows a 3d representation in exploded view of a gateway 2.
Figure 3:
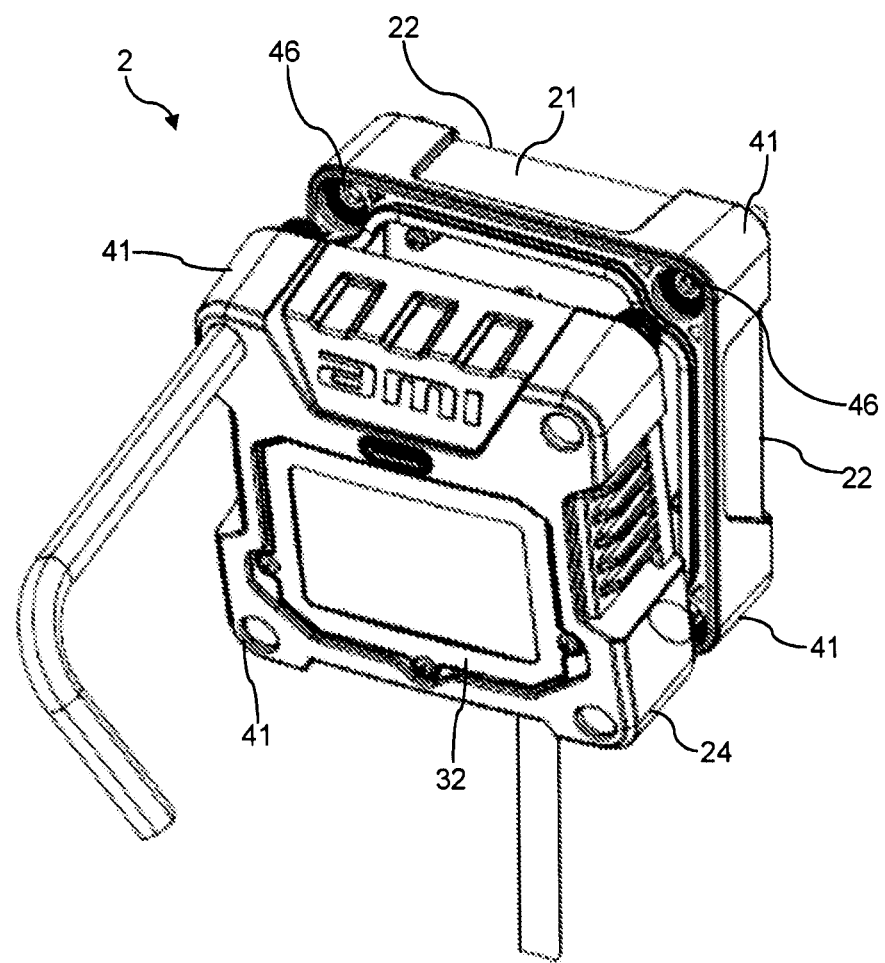
FIG. 3 shows the gateway with the cover in the process of being loosened from the base element.

FIG. 2 shows an exploded view of the moisture tight enclosure 20 of the gateway 2. The enclosure is comprised of a square base element 21 and a cover 24, and the cover 24 and base element 21 are adapted to seal against each other along a rim 28, with a gasket 26 inserted along a sealing line. In order to ensure pressure at the entire gasket 26 along the sealing line, the cover is secured against the base element by connection screws 42. As seen in FIG. 2 the screws 42 are placed, one in each corner 41 of the square base element 21 and outside the sealing line. The connection screws 42 are tube-shaped so that each of them has a through-going hole 44 along the central axis thereof. The mounting screws 42 has, at one end thereof, internal Allen wrench connection surfaces 45 and at the opposed end there are external threads 47.

As seen in FIG. 2, the mounting screws 46 may be inserted in holes at each corner of the cover 24 and screwed into internally threaded holes in the base element 21. The holes through the connection screws 42 allows the insertion of mounting screws 46 therethrough, such that the mounting screws 46 pass through the internally threaded holes in the base element and may be screwed into a mounting base 48. The mounting screws 46 may be accessed through the through-going holes 44 of the connection screws 42 for releasing or tightening. By this construction it becomes possible to secure or release the moisture tight enclosure 20 to/from a mounting base 48 without opening the enclosure, and it becomes possible to take the cover 24 apart from the base element 21 without demounting the entire enclosure 20.

The tight build of the enclosure 20 allows the base element to have a very limited footprint 22. Preferably the footprint is not above 10.000 mm2, and in the disclosed embodiment the footprint 22 is no more than 8500 mm2.

Figure 6:
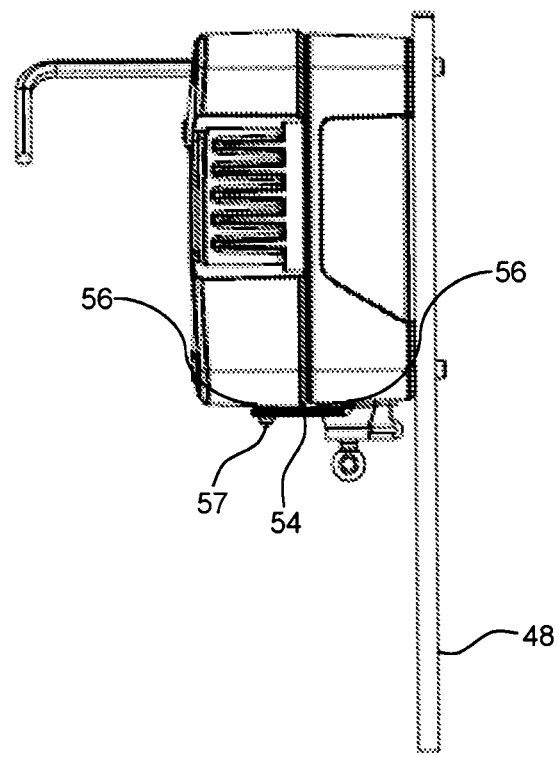
FIG. 6 is a sideview of the gateway housing mounted on a mounting base 48.

As seen in FIG. 4A the footprint of the base element is used to accommodate a base PCB 58, which is mounted into the base element 21 in parallel with a bottom wall, and when this wall is attached to the mounting base as shown in FIG. 6, the base PCB 58 shall also be parallel to the mounting base. The accelerometer (indicated in FIG. 7) is provided on the base PCB and mounted thereon in the usual way but care has been taken, that it sits next to a connection screw, which ensures that the PCB is immovably fixed to the bottom wall of the base element 21. This ensures, that vibrations transmitted through the mounting base, shall reach the accelerometer undistorted and un-attenuated.

A top PCB 59 is also provided, which sits above base PCB 58. Top PCB 59 does not fill out the entire space inside the rim 28, such that external connection leads may fan out above the base PCB 58 in order to reach the input and output terminals 17 mounted on the top PCB 59 along a lover edge thereof. This is seen in FIG. 4A.

In FIG. 2, skins 50,52 or sleeves which are designed to at least partially cover external surfaces of the base element 21 and cover 24 are disclosed. The two skins 50,52 are made in flexible rubbery material, preferably a polymer composition with rubber properties, which is mouldable by injection moulding.

The base skin 50 comprises tether strips 54, which extend from one particular exterior side 56 of the base element 21 and are attachable to corresponding protrusions 57 at the exterior of the cover skin 52 and arranged at the corresponding one particular side 56 thereof. As seen in FIG. 2 and FIG. 4C the one particular exterior side 56 is the side also comprising lead entrances for the input and output leads which feeds wired signals to/from the gateway 2. This allows the cover to be unscrewed from the base element, while it is flexibly attached thereto by the tether strips 54. The connection between the tether strips and the protrusions is detachable and is made as a click-connection. The protrusion 57 has a head and a narrower neck part, and the tether strip comprises, at the end thereof, a ring-shaped element, which may be pried over the head and sit tightly around the neck part.

In an alternative to this construction, the base element and the cover may be pivotally linked directly to each other by well-known means such as a hinge and hinge pin construction (not illustrated in figure).

Figure 8:
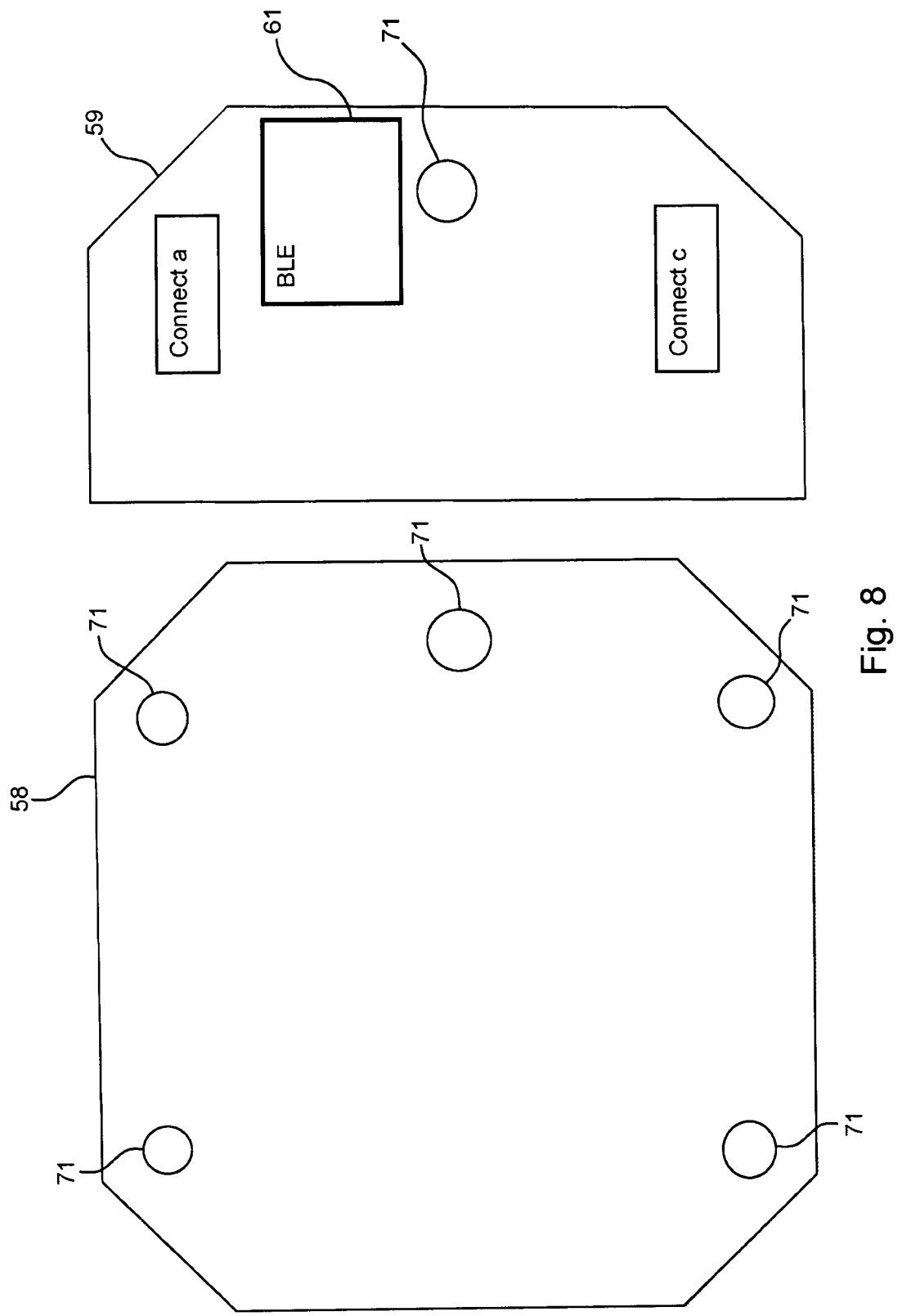
FIG. 8 is a schematic back view of the two PCB elements.

In FIG. 7 and FIG. 8 the base PCB 58 is shown next to the top PCB 59 in FIG. 7. When top PCB 59 is attached above base PCB 58, the connectors c and a labelled 63 shall connect to connectors d and b labelled 64 respectively, such that an array of pins in each connector 63, 64 shall ensure that signal and power paths are provided between the two PCBs for seamless communication. In FIG. 8 the back side of the PCB is shown, and here only a few components are present, of which only the most important are shown. The connectors c and a sit here and are represented in FIG. 7 in dashed line to indicate their position on an opposed side. The cellular module 7 may comprise a sim card 74 possibly embedded therewith. Also connected to the cellular module 7, a cellular module antenna 65 is provided. The antenna 65 is only indicated schematically in FIG. 7 but may comprise a coil with a coil axis perpendicular to the plane of the PCB 58. The coil may be an open-ended coil. As top PCB 59 does not extend over base PCB 58 at the location of cellular module antenna 65, there is room for an antenna coil at this place within the gateway enclosure. A dedicated communication line 73 comprising a multitude of leads is provided between the cellular device 7 and a CPU 67. The 900 MHz radio transceiver 1 is embedded in the CPU 67. As seen, the CPU 67 has communication lines to each of the active devices, of which the most important are disclosed in FIG. 7. A flash memory 68 and an EE prom 69 are usual necessities and provided on the PCB, however their location is not critical and may deviate from the disclosed. The RS485 module is shown with a connection line to the CPU, however it may also have one or more dedicated communication lines (not shown in the drawing) to the input and output connectors 17. An antenna 66 is disclosed schematically next to the 900 MHz transceiver 1 (also seen in FIG. 4C), and this antenna is preferably a coil antenna with a coil axis parallel to the plane of the base PCB 58. This allows the coil to sit between the two PCBs and also by this positioning it may have a coil axis, which is orthogonal to the coil axis of cellular antenna 65, which could ensure less interference between the two antennas, which may have to be active simultaneously. As seen in FIG. 4C the coil antenna 66 is open ended as is known in the art.

The reed switch 49 is disclosed close to the rim of base PCB 58, and this position ensures that the reed switch is close to an upper exterior wall of the gateway casing. Thereby it shall be sensitive to a magnetic field, which will be present whenever an employee places a magnet close to the exterior of the enclosure.

As seen the GPS 62 and the Bluetooth Low Energy (BLE) communication module 61 shares a communication line 72 through connector c 63 and connector d 64 to the CPU 67 and/or 900 Mhz radio. This is usually not possible and is only enabled by ensuring that the CPU only communicates with the GPS 62 whenever the BLE module 61 is not active.

The BLE module 61 is shown in FIG. 8 in full line, as its location is at the backside of the top PCB 59. Both BLE module 61 and GPS 62 comprise antennas, but they may be provided as patch antennas on the PCB and are not disclosed in the Figures.

Power supply and power supply lines shall be supplied according to usual practice in the field, and passives comprising resistors and capacities are also used where appropriate even if not disclosed. A number of diodes are also part of the device, but are not described or shown as they are used in well-known manner, including the use of a light diode to provide an indicator light on an exterior part of the enclosure. Leads are provided on both sides of the PCB and may also be embedded in several layers in the PCB as is known in the art.

LIST OF REFERENCE NUMERALS 32-lid
33-battery lid gasket
34-an opening
36-partition wall
38-battery connectors
39-solder pads
40-battery leads
41-corner
42-connection screw
43-partition wall gasket
44-through going hole
45-Allen wrench connection surfaces
46-mounting screw
47-threads at connection screw
48-mounting base
49-reed switch
50-base skin
52-cover skin
54-tether strips
56-one particular exterior side
57-protrusions
58-base PCB
59-top PCB
60-external connection leads
61-BLE transceiver
62-GPS
63-connectors a and c
64-connectors b and d
65-cellular module antenna
66-900 MHz radio antenna
67-CPU/microcontroller unit
68-flash memory
69-EEprom
70-accelerometer
71-through going hole for mounting screw
72-shared communication line
73-dedicated communication line
74-SIM card
75-pump101-Signal formatting circuitry
102-Raw input signal
104-Formatted electrical input signal
105-Input line
106-Signal processing device
108-Programmable device
110-First output control signal
111-Second output control signal
Q10-A-First switching device
114-Ground potential
Q10-B-Second switching device R32-Resistor
R22-B-Resistor
R28-High precision resistor
124-Security circuit

The invention claimed is:

1. A method by which an electrical raw input signal is received and reshaped to a formatted electrical input signal according to input requirements of a signal processing device, characterized in that the method comprises the steps of:
feeding a received parameter to a programmable device according to an expected raw input signal format in order that,
the programmable device delivers one or more output control signals based on the received parameter whereby,
each control signal is served at a respective switching device provided in a signal line arranged between a potential of the electrical raw input signal and ground potential wherein,
each control signal allows the respective switching device to connect the potential of the raw input signal to ground potential through a resistor of predetermined size, whereby a terminal of the resistor is connected to the electrical raw input signal and another terminal is connected to ground potential to create the formatted electrical input signal at the terminal of the resistor connected to the potential of the electrical raw input signal,
the formatted electrical input signal is transmitted by the signal processing device to a remote data storage facility via a cellular connection, wherein a transmission schedule depends on whether at least one of external power supply is available, only battery power is available or no external power supply is available and battery is low.

2. A method according to claim 1, characterized in that a first switching device in a closed state connects the electrical raw input signal to ground potential through at least one resistor, and in an open state allows the raw input signal to feed into the signal processing device unchanged.

3. A method according to claim 1, characterized in that a second switching device in an open state leaves the electrical raw input signal unchanged, and in a closed state connects the electrical raw input signal to ground potential through a high precision resistor which has a resistor value within an accuracy of 1% and has a linear characteristic whereby an accurate voltage division is allowed, such that irrespective of the current level in the high precision resistor, the voltage level in an input line in front of the high precision resistor is a measure of the current running through the high precision resistor.

4. A method according to claim 3, characterized in that:
a first switching device in a closed state connects the electrical raw input signal to ground potential through at least one resistor, and in an open state allows the raw input signal to feed into the signal processing device unchanged, and
the first switching device receives a control signal in order to be open whenever the second switching device receives a control signal in order to be closed.

5. A gateway adapted to receive a range of wireless and wired sensory input, which are processed and packaged and then delivered to a remote data storage facility by use of a cellular network and an on board cellular device, wherein the gateway comprises a signal formatting circuitry and programmable signal processing device where the signal formatting circuitry is adapted to receive an electrical raw input signal and comprise means to reshape the raw input signal to a formatted electrical input signal according to input requirements of the programmable signal processing device, characterized in that the programmable signal processing device is programmed to deliver control signals according to a received parameter, in accordance with an expected raw input signal format, and that further;
the programmable signal processing device is adapted to deliver output control signals at switching devices provided in a signal line arranged between a potential of the electrical raw input signal and ground potential wherein,
the switching devices are adapted to connect the electrical raw input signal to the ground potential through a respective resister of predetermined size, whereby a terminal of the resistor is connected to the electrical raw input signal and another terminal is connected to ground potential to create a formatted input signal at the terminal of the resistor connected to the electrical raw input signal,
the formatted electrical input signal is transmitted to the remote data storage facility via the on board cellular device, wherein a transmission schedule depends on whether at least one of external power supply is available, only battery power is available or no external power supply is available and battery is low.

6. The gateway according to claim 5, characterized in that a first switching device is provided, which in a closed state is adapted to connect the electrical raw input signal to ground potential through at least one resistor, and in an open state is adapted to connect the electrical raw input signal to the programmable signal processing device unchanged in order to gain two differently reshaped input signals, formatted according to a level of their respective electrical raw input signal.

7. The gateway according to claim 5, characterized in that a second switching device is provided which in an open state is adapted to leave the raw input signal unchanged, and in a closed state is adapted to connect the raw input signal to ground potential through a high precision resistor which has a resistor value within 1% accuracy and has a linear characteristic whereby an accurate voltage division is allowed, such that irrespective of the current level in the high precision resistor, the voltage level in the input line in front of the high precision resistor is a measure of a current running through the high precision resistor.

8. The gateway according to claim 7, characterized in that:
a first switching device is provided, which in a closed state is adapted to connect the electrical raw input signal to ground potential through at least one resistor, and in an open state is adapted to connect the electrical raw input signal to the programmable signal processing device unchanged in order to gain two differently reshaped input signals, formatted according to a level of their respective electrical raw input signal, and
the first switching device and the second switching device are part of one and the same dual n-channel MOSFET device.

9. The gateway according to claim 8, characterized in that the first switching device and the second switching device are part of one and the same dual n-channel MOSFET device.

10. The gateway according to claim 9, characterized in that the programmable signal processing device is adapted to receive a formatted input signal in the range of 0.0 VDC to 2.5 VDC, and that a smaller resistor and a high precision resistor are dimensioned such that electrical raw input signal in the ranges 0.0-2.50 VDC, 0-10 VDC and 0-20 mA are each transferred to a range of the formatted input signal depending on output control signals provided from the programmable device to the dual n-channel MOSFET device.

11. The gateway according to claim 5, further comprising:
a BLE (Bluetooth Low Energy) transceiver;
a GPS receiver;
wherein the BLE transceiver and GPS receiver are connected to a shared communication line of the programmable signal processing device.

12. The gateway according to claim 11, wherein the connection of the BLE transceiver and the GPS receiver to the programmable signal processing device is controlled by a switch operated by a magnet.

* * * * *